(12) United States Patent
Dillenseger et al.

(10) Patent No.: US 9,381,565 B2
(45) Date of Patent: Jul. 5, 2016

(54) MONOCRYSTALLINE CASTING MOLD

(71) Applicant: SNECMA, Paris (FR)

(72) Inventors: Serge Dillenseger, Ennery (FR); Dominique Coyez, Conflans-Sainte-Honorine (FR); Serge Fargeas, Sacey (FR); Hervé Gras, Paris (FR); Didier Maurice Marceau Guerche, Conflans-Sainte-Honorine (FR)

(73) Assignee: SNECMA, Paris (FR)

( * ) Notice: Subject to any disclaimer, the term of this patent is extended or adjusted under 35 U.S.C. 154(b) by 0 days.

(21) Appl. No.: 14/783,069

(22) PCT Filed: Apr. 9, 2014

(86) PCT No.: PCT/FR2014/050845
§ 371 (c)(1),
(2) Date: Oct. 7, 2015

(87) PCT Pub. No.: WO2014/167243
PCT Pub. Date: Oct. 16, 2014

(65) Prior Publication Data
US 2016/0052046 A1    Feb. 25, 2016

(30) Foreign Application Priority Data
Apr. 10, 2013  (FR) .................................... 13 53223

(51) Int. Cl.
| | |
|---|---|
| *B22D 27/04* | (2006.01) |
| *B22C 9/04* | (2006.01) |
| *C30B 11/00* | (2006.01) |
| *C30B 29/02* | (2006.01) |
| *C30B 29/52* | (2006.01) |

(52) U.S. Cl.
CPC ............... *B22C 9/04* (2013.01); *B22D 27/045* (2013.01); *C30B 11/00* (2013.01); *C30B 11/002* (2013.01); *C30B 29/02* (2013.01); *C30B 29/52* (2013.01)

(58) Field of Classification Search
CPC ............................. B22D 27/045; C30B 11/002
USPC ...................................... 164/122–122.2, 361
See application file for complete search history.

(56) References Cited

U.S. PATENT DOCUMENTS

| | | | |
|---|---|---|---|
| 4,548,255 A | 10/1985 | Reiner et al. | |
| 4,940,073 A | 7/1990 | Jeyarajan et al. | |
| 5,062,468 A * | 11/1991 | Monte ................... | C30B 11/002 164/122.2 |
| 5,062,469 A * | 11/1991 | Monte ................... | C30B 11/002 164/122.2 |

FOREIGN PATENT DOCUMENTS

| | | |
|---|---|---|
| FR | 2 734 187 A1 | 11/1996 |
| FR | 2 734 189 A1 | 11/1996 |

OTHER PUBLICATIONS

English Translation of Search Report mailed on Sep. 9, 2014, in corresponding International PCT Application No. PCT/FR2014/050845, filed on Apr. 9, 2014 (2 pages).

* cited by examiner

*Primary Examiner* — Kevin E Yoon
(74) *Attorney, Agent, or Firm* — Bookoff McAndrews, PLLC

(57) ABSTRACT

The invention relates to the field of monocrystalline casting, and in particular to a mold (1) for monocristalline casting comprising at least a molding cavity (7), a starter cavity (10) having at least a first volume (10*a*) in the form of an upside-down funnel, and a distinct second volume (10*b*) forming a plinth at the bottom of the first volume and projecting perceptibly relative to said first volume in at least one horizontal direction, a selector channel (9) connecting said starter cavity (10) to said molding cavity (7), and a support rod (20) that is laterally offset relative to said selector channel, and that connects the second volume (10*b*) of the starter cavity (10) to the molding cavity (7). The invention also provides a casting method using such a mold (1).

9 Claims, 3 Drawing Sheets

MONOCRYSTALLINE CASTING MOLD

CROSS-REFERENCE TO RELATED APPLICATIONS

This application is the U.S. national phase entry under 35 U.S.C. §371 of International PCT Application No. PCT/FR2014/050845, filed on Apr. 9, 2014, which claims priority to French Patent Application No. FR 1353223 filed on Apr. 10, 2013, the entireties of each of which are incorporated by reference herein.

BACKGROUND OF THE INVENTION

The present invention relates to the field of casting, and more particularly to a mold for casting, and also to methods of fabricating shell molds, and to methods of casting using a mold.

In the description below, the terms "high", "low", "horizontal", and "vertical" are defined by the normal orientation of such a mold while metal is being cast into it.

So-called "lost-wax" or "lost-pattern" casting methods have been known since antiquity. They are particularly suitable for producing metal parts that are complex in shape. Thus, lost-pattern casting is used in particular for producing turbine engine blades.

In lost-pattern casting, the first step normally comprises making a pattern out of a material having a melting temperature that is comparatively low, such as for example out of wax or resin. The pattern is itself coated in refractory material in order to form a mold, and in particular a mold of the shell mold type. After removing or eliminating the material of the pattern from the inside of the mold, which is why such methods are referred to as lost pattern casting methods, molten metal is cast into the mold in order to fill the cavity that the pattern has formed inside the mold by being removed or eliminated therefrom. Once the metal has cooled and solidified, the mold may be opened or destroyed in order to recover a metal part having the shape of the pattern. In the present context, the term "metal" should be understood to cover not only pure metals but also, and above all, metal alloys.

In order to be able to make a plurality of parts simultaneously, it is possible to unite a plurality of patterns in a single assembly in which they are connected together by a tree that forms casting channels in the mold for the molten metal.

Among the various types of mold that can be used in lost-pattern casting, so-called "shell" molds are known that are formed by dipping the pattern or the assembly of patterns into a slip, and then dusting refractory sand onto the pattern or the assembly of patterns coated in the slip in order to form a shell around the pattern or the assembly, and then baking the shell in order to sinter it and thus consolidate the slip and the sand. Several successive operations of dipping and dusting may be envisaged in order to obtain a shell of sufficient thickness prior to baking it. The term "refractory sand" is used in the present context to designate any granular material of grain size that is sufficiently small to satisfy the desired production tolerances, that is capable, while in the solid state, of withstanding the temperature of the molten metal, and that is capable of being consolidated into a single piece during baking of the shell.

In order to obtain particularly advantageous thermomechanical properties in the part produced by casting, it may be desirable to ensure that the metal undergoes directional solidification in the mold. The term "directional solidification" is used in the present context to mean that control is exerted over the nucleation and the growth of solid crystals in the molten metal as it passes from the liquid state to the solid state. The purpose of such directional solidification is to avoid the negative effects of grain boundaries within the part. Thus, the directional solidification may be columnar or monocrystalline. Columnar directional solidification consists in orienting all of the grain boundaries in the same direction so that they cannot contribute to propagating cracks. Monocrystalline directional solidification consists in ensuring that the part solidifies as a single crystal, so as to eliminate all grain boundaries.

In order to obtain such monocrystalline directional solidification, the mold typically presents, beneath the molding cavity, a starter cavity that is connected to the molding cavity by a selector channel, as disclosed by way of example in French patent FR 2 734 189 and U.S. Pat. No. 4,548,255. While the metal is solidifying in the mold, the mold is cooled progressively starting from the starter cavity so as to cause crystals to nucleate therein. The role of the selector channel is firstly to favor a single grain, and secondly to enable the single grain to advance towards the molding cavity from the crystallization front of this grain that nucleated in the starter cavity.

A drawback of that configuration is nevertheless that of ensuring that the mold has mechanical strength, in particular when the mold is of the so-called "shell mold" type, made up of relatively thin walls around the cavities and channels that are to receive the molten metal, since the molding cavity occupies a high position above a starter cavity that is normally smaller. For this purpose, it is common practice, as shown in U.S. Pat. No. 4,940,073, to incorporate support rods in the mold.

Nevertheless, such support rods, which penetrate into the starter and molding cavities can interfere with grain nucleation and propagation.

OBJECT AND SUMMARY OF THE INVENTION

The invention thus seeks to remedy those drawbacks by proposing a mold for monocrystalline casting with a molding cavity, a support rod, a starter cavity of shape enabling grains to nucleate, and providing a support appropriate for the support rod, and a selector channel connected to the top of the starter cavity for propagating a single grain to the molding cavity.

In at least one embodiment, this object is achieved by the fact that the starter cavity comprises at least a first volume in the form of upside-down funnel, and a distinct second volume forming a plinth, located at the bottom of the first volume and projecting perceptibly relative to said first volume in at least one horizontal direction, and in that the support rod is laterally offset relative to the selector channel and is connects the second volume of the starter cavity to the molding cavity. The term "in the form of an upside-down funnel" is used to mean a shape having a converging profile such that the greatest cross-section of the first volume is located adjacent to the second volume and the smallest cross-section of the first volume is located remote from the second volume. This shape is not necessarily conical nor axisymmetric. The term "projecting perceptibly" is used to mean that the horizontal difference between the bottom edge of the first volume and the top edge of the second volume can easily be detected by conventional measuring means. This horizontal projection of the second volume thus makes it possible to provide a stable base for the support rod in spite of being laterally offset, thus making it possible to avoid interfering with grains being selected in the transition between the starter cavity and the selector channel via the funnel-shaped first volume.

In particular, the second volume may project horizontally around the entire perimeter of said first volume, thereby creating a discontinuity between the first and second volumes, which discontinuity contributes to selecting grains.

In addition, said first volume may be axisymmetric about a vertical axis, thus facilitating the transition towards a selector channel of round section, thereby reducing the risk of interfering grains nucleating, and also reducing the risk of weak points in the walls of the mold.

Furthermore, said second volume may be non-axisymmetric about a vertical axis, in particular in order to facilitate positioning the meltable pattern for the starter cavity when assembling an assembly of patterns for fabricating the mold. Nevertheless, the second volume may in particular be symmetrical relative to a vertical plane, thereby facilitating the use of injection molding to produce the meltable pattern that is to be used for forming this cavity, by making the pattern easier to unmold.

In order to obtain temperature conditions that are particularly uniform in said first volume and in the selector channel, the lateral offset of the support rod relative to the selector channel may be such that a minimum distance between the support rod and the first volume is greater than the sum of a thickness of the mold around the support rod plus a thickness of the mold around the first volume. The mold may in particular be a mold of the "shell" mold type, produced by a "lost wax" or "lost pattern" method, thereby making it possible to obtain a mold with walls that are relatively thin.

In particular, said selector channel may be a baffle-forming selector channel, specifically for the purpose of reliably ensuring that a single crystal grain is selected. In addition, said selector channel may present a cross-section that is round, in particular for ensuring the integrity of the mold walls around the selector channel, and also for avoiding interfering grains nucleating in the sharp corners of the selector channel.

The invention also provides a casting method comprising at least fabricating such a mold, e.g. by the "lost wax" or "lost pattern" method, casting molten metal into the mold, cooling the metal with directional solidification of the metal starting from the starter cavity, and knocking out the mold in order to recover the raw metal casting. By way of example, this method may also include an additional step of finishing the raw metal casting.

BRIEF DESCRIPTION OF THE DRAWINGS

The invention can be well understood and its advantages appear better on reading the following detailed description of an embodiment given by way of non-limiting example. The description refers to the accompanying drawings, in which.

DETAILED DESCRIPTION OF THE INVENTION

Figure 1:
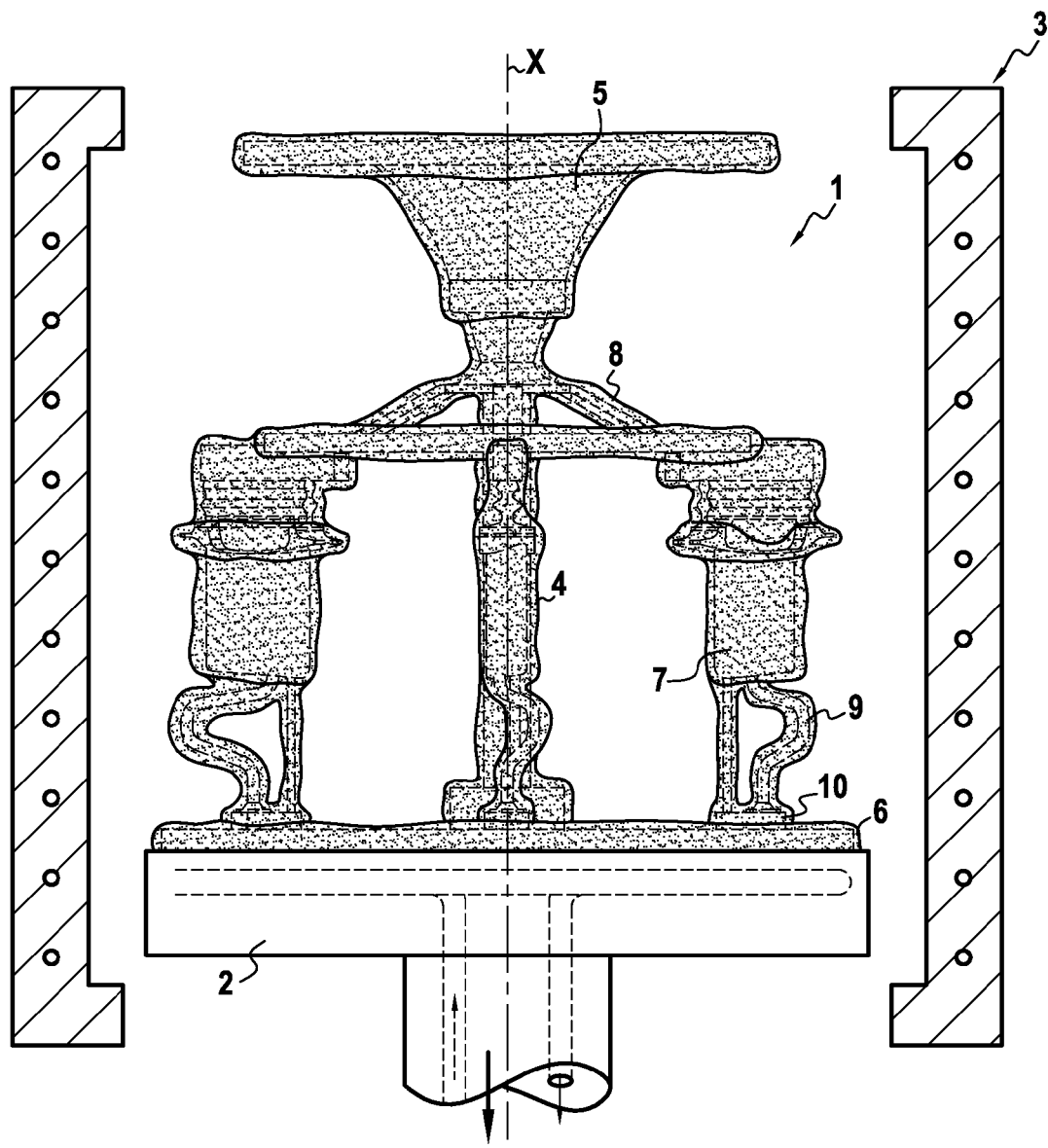
FIG. 1 is a diagram showing the implementation of a directional solidification casting method.

FIG. 1 shows how progressive cooling of the molten metal in order to obtain directional solidification can typically be performed in a casting method.

The shell mold 1 used in this method comprises a central descender 4 extending along the main axis X between a casting cup 5 and a plate-shaped base 6. While the shell mold 1 is being extracted from the heater chamber 3, the base 6 is directly in contact with a soleplate 2. The shell mold 1 also has a plurality of molding cavities 7 arranged as an assembly around the central descender 4. Each molding cavity 7 is connected to the casting cup 5 by a feed channel 8 through which the molten metal is inserted while it is being cast. Each molding cavity 7 is also connected at the bottom via a baffle-selector channel 9 to a smaller starter cavity 10 adjacent to the base 6.

Figure 2:
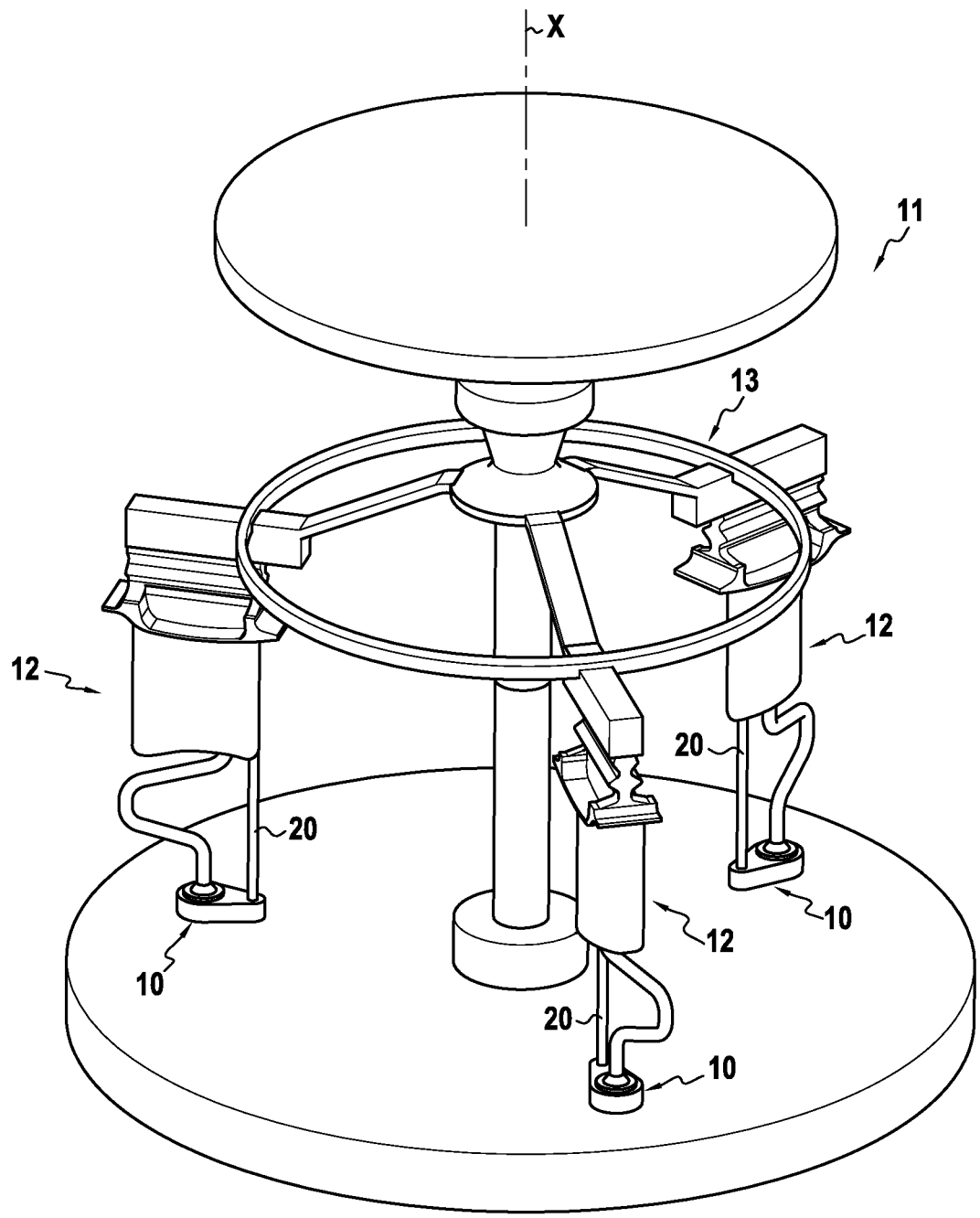
FIG. 2 is a diagram showing an assembly of casting patterns.

The shell mold 1 may be produced by the so-called "lost-wax" or "lost-pattern" method. A first step of such a method is creating a non-permanent assembly 11 comprising a plurality of patterns 12 connected together by a tree 13, as shown in FIG. 2. The patterns 12 and the tree 13 are for forming hollow volumes in the shell mold 1. They are obtained using a material having a low melting temperature, such as a suitable resin or wax. When it is intended to produce large numbers of parts, it is possible in particular to produce these elements by injecting the resin or wax into a permanent mold. In order to support each pattern 12, a support rod 20 made of refractory material, e.g. of ceramic, connects each of the models 12 to the base of the assembly 11.

In this implementation, in order to produce the shell mold 1 from the non-permanent assembly 11, the assembly 11 is dipped in a slip, and then dusted with refractory sand. These dipping and dusting steps may be repeated several times, until a shell of slip-impregnated sand of desired thickness has been formed around the assembly 11.

The assembly 11 covered in this shell can then be heated so as to melt the low melting-temperature material of the assembly 11 and remove it from the inside of the shell. Thereafter, in a higher temperature baking step, the shell is sintered so as to consolidate the refractory sand and form the shell mold 1.

The metal or metal alloy used in this casting method is cast while molten into the shell mold 1 via the casting cup 5, and it fills the molding cavities 7 via the feed channels 8. During this casting, the shell mold 1 is kept in a heater chamber 3, as shown in FIG. 1. Thereafter, in order to cause the molten metal to cool progressively, the shell mold 1 supported by a cooled and movable support 2 is extracted from the heater chamber 3 downwards along the main axis X. Since the shell mold 1 is cooled via its base 6 by the support 2, the solidification of the molten metal is triggered in the starters 10 and it propagates upwards during the progressive downward extraction of the shell mold 1 from the heater chamber 3, along the arrow shown in FIG. 1. The constriction formed by each selector 9, and also its baffle shape, nevertheless serve to ensure that only one of the grains that nucleates initially in each of the starter cavities 10 is capable of continuing so as to extend to the corresponding molding cavity 7.

Among the metal alloys that are suitable for use in this method, there are to be found in particular monocrystalline nickel alloys such as in particular AM1 and AM3 from Snecma, and also other alloys such as CMSX-2®, CMSX-4®, CMSX-6®, and CMSX-10® from C-M Group, René® N5 and N6 from General Electric, RR2000 and SRR99 from Rolls-Royce, and PWA 1480, 1484, and 1487 from Pratt & Whitney, amongst others. Table 1 summarizes the compositions of these alloys:

TABLE 1

Monocrystalline nickel alloys in weight percentages

| Alloy | Cr | Co | Mo | W | Al | Ti | Ta | Nb | Re | Hf | C | B | Ni |
|---|---|---|---|---|---|---|---|---|---|---|---|---|---|
| CMSX-2 | 8.0 | 5.0 | 0.6 | 8.0 | 5.6 | 1.0 | 6.0 | — | — | — | — | — | Bal |
| CMSX-4 | 6.5 | 9.6 | 0.6 | 6.4 | 5.6 | 1.0 | 6.5 | — | 3.0 | 0.1 | — | — | Bal |
| CMSX-6 | 10.0 | 5.0 | 3.0 | — | 4.8 | 4.7 | 6.0 | — | — | 0.1 | — | — | Bal |
| CMSX-10 | 2.0 | 3.0 | 0.4 | 5.0 | 5.7 | 0.2 | 8.0 | — | 6.0 | 0.03 | — | — | Bal |
| René N5 | 7.0 | 8.0 | 2.0 | 5.0 | 6.2 | — | 7.0 | — | 3.0 | 0.2 | — | — | Bal |
| René N6 | 4.2 | 12.5 | 1.4 | 6.0 | 5.75 | — | 7.2 | — | 5.4 | 0.15 | 0.05 | 0.004 | Bal |
| RR2000 | 10.0 | 15.0 | 3.0 | — | 5.5 | 4.0 | — | — | — | — | — | — | Bal |
| SRR99 | 8.0 | 5.0 | — | 10.0 | 5.5 | 2.2 | 12.0 | — | — | — | — | — | Bal |
| PWA1480 | 10.0 | 5.0 | — | 4.0 | 5.0 | 1.5 | 12.0 | — | — | — | 0.07 | — | Bal |
| PWA1484 | 5.0 | 10.0 | 2.0 | 6.0 | 5.6 | — | 9.0 | — | 3.0 | 0.1 | — | — | Bal |
| PWA1487 | 5.0 | 10.0 | 1.9 | 5.9 | 5.6 | — | 8.4 | — | 3.0 | 0.25 | — | — | Bal |
| AM1 | 7.0 | 8.0 | 2.0 | 5.0 | 5.0 | 1.8 | 8.0 | 1.0 | — | — | — | — | Bal |
| AM3 | 8.0 | 5.5 | 2.25 | 5.0 | 6.0 | 2.0 | 3.5 | — | — | — | — | — | Bal |

After the metal has cooled and solidified in the shell mold, the mold can be knocked out so as to release the metal parts, which can then be finished by machining and/or surface treatment methods.

Figure 3:
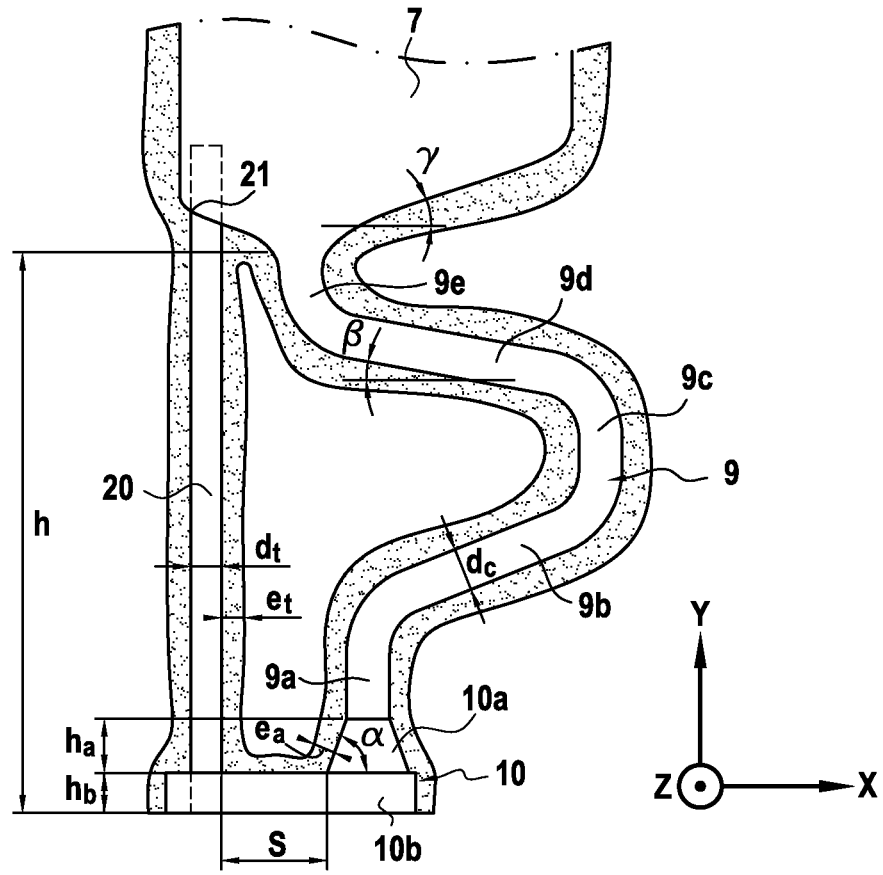
FIG. 3 is a side view of the starter cavity in an embodiment of the invention, with the corresponding selector channel, and also a portion of the corresponding molding cavity, and a ceramic support rod.

FIG. 3 shows more specifically the shape of one of the starter cavities 10, with the corresponding selector channel 9, together with a portion of the molding cavity 7 connected to the starter cavity 10 via the selector channel 9. It can thus be seen how the starter cavity 10 comprises a first volume 10a of the type comprising an upwardly converging profile, i.e. in the form of an upside-down funnel, and a distinct second volume 10b at the bottom of the first volume 10a. The upward convergence of the first volume is such that the greatest cross-section of the first volume is located adjacent to the second volume and the smallest cross-section of the first volume is located remote from the second volume. In other words, the greatest cross-section of the first volume 10a is in a position that is lower than its smallest cross-section in the orientation of FIG. 3. Advantageously, this second volume 10b presents a horizontally arranged cross-section that is substantially constant, projecting laterally relative to the first volume 10a all around the first volume 10a, but to a greater extent in a main direction. The bottom end of the rod 20 is received in this lateral projection of the second volume 10b.

In the embodiment shown, the second volume 10b presents a height $h_b$ of at least 5 millimeters (mm) in order to provide sufficient anchoring for the rod 20. The top edge of the second volume 10b is rounded in order to avoid stress concentrations and consequently cracks at this location in the shell mold 1. Such cracks could lead to fine leaks of metal contained in the wall of the shell mold 1, which could constitute sites for nucleating interfering grains. The radius of this rounded portion may be about 0.5 mm, for example.

The transitions between the first volume 10a and the second volume 10b, and also between the first volume 10a and the selector channel 9 are likewise rounded for the same reasons. The angle of inclination α (ALPHA) relative to the horizontal of one or more walls of the first volume 10a in a plane that is assumed to be vertical may lie in the range 40° to 70°, for example. This angle of inclination enables a first grain selection operation to be performed and avoids shrink marks at the end of solidification that could generate sites for nucleating interfering grains. Nevertheless, other angles of inclination could be envisaged, depending on the shape of the first volume 10a.

Although in the embodiment shown this first volume 10a is frustoconical in shape, other shapes of upwardly decreasing horizontal section, and more particularly but not exclusively shapes that are axisymmetric, could equally well be envisaged. For example, a hemispherical shape with its convex side pointing upwards could also be envisaged. Independently of its shape, the height $h_a$ of the first volume 10a may for example lie in the range 2 mm to 20 mm.

The selector channel 9 is in the form of a baffle having five successive elements 9a to 9e, of substantially constant round cross-section with a diameter $d_c$ of at least 5 mm, and preferably lying in the range 6 mm to 8 mm, for example. This range of diameters makes it possible to achieve single grain selection while avoiding too small a diameter for the selector channel 9, which could lead to cracks forming in the walls of the shell mold 1, which would encourage the nucleation of interfering grains. For the same reason, the connections between the successive segments 9a to 9e are rounded, e.g. with a radius of about 7 mm. These five successive segments 9a to 9e comprise first and fifth segments 9a and 9e that are substantially vertical, a third segment 9c that is substantially vertical as well, but that is laterally offset relative to the first and fifth segments 9a and 9e, and sloping second and fourth segments 9b and 9d that connect the ends of the third segment 9c respectively to said first and fifth segments 9a and 9e. The angle of inclination β (BETA) of said second and fourth segments 9b and 9d relative to the horizontal may lie in the range 5° to 45°, for example. The overall height h of the entire starter cavity 10 plus the selector channel 9 may lie in the range 30 mm to 40 mm, for example.

The bottom portion of the molding cavity 7 can also be seen in FIG. 3. In order to provide the transition between the selector channel 9 and the molding cavity 7, so as to avoid creating interfering grains at this critical location of the mold 1, the bottom edges of the molding cavity 7 are sloping and rounded. The angle of inclination γ (GAMMA) of these edges relative to the horizontal may likewise lie in the range 5° to 45°, for example. A canonical curve connects these rounded edges to the selector channel 9. This canonical curve is constituted by rounded portions with radii close to those of the edges, in order to avoid changes of shape that would contribute to nucleating interfering grains.

The rod 20 penetrates into the molding cavity 7 through one of its rounded bottom edges. In order to avoid forming gaps that might constitute sites for nucleating interfering metal grains, the connection 21 between the rod 20 and the molding cavity 7 presents the smallest possible angle radius, or none, with this applying all around the rod 20. The support rod 20 may be made of a refractory material such as a ceramic, in particular alumina, and it may present a cross-section of diameter $d_r$ of 3 mm, for example.

Figure 4:
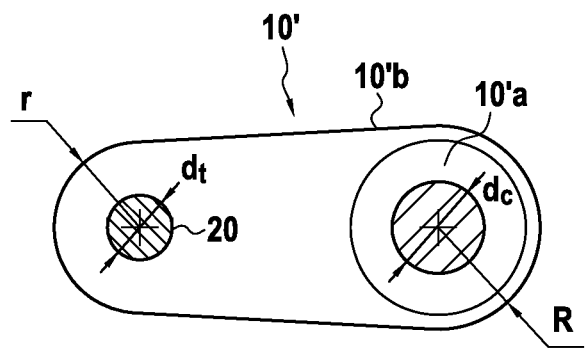
FIG. 4 is a plan view of a meltable pattern for the starter cavity of FIG. 3.

FIG. 4 is a plan view of the meltable pattern 10' used for forming the starter cavity 10. The shapes of the first and second volumes 10'a and 10'b of this meltable pattern 10' correspond to the shapes of the first and second volumes 10a and 10b of the starter cavity 10. As can be seen in the figure, the second volume 10'b of this meltable pattern 10' presents a symmetrical horizontal section formed by two circular arcs of different radii, having their ends connected together by straight lines. This shape serves in particular to ensure that the pattern 10' is properly oriented when assembling the assembly 11. One of said circular arcs, of radius R, is centered on the central axis of the first volume 10'a of the meltable pattern 10', while the other circular arc, of radius r substantially smaller than the radius R, is centered on the central axis of the rod 20. The minimum distance S between the rod 20 and the first volume 10a of the starter cavity 10 is greater than the sum of the thicknesses $e_r$ and $e_a$ of the walls of the mold 1 respectively around said rod 20 and around said first volume 10a, so as to avoid these walls overlapping, since that would be harmful to temperature uniformity within said first volume 10a of the starter cavity 10.

Although the present invention is described with reference to a specific embodiment, it is clear that various modifications and changes may be made thereto without going beyond the general ambit of the invention as defined by the claims. In addition, individual characteristics of the various embodiments mentioned may be combined in additional embodiments. Consequently, the description and the drawings should be considered in an illustrative sense rather than in a restrictive sense.

The invention claimed is:

1. A mold for monocrystalline casting, the mold comprising at least:
   a molding cavity;
   a starter cavity having at least:
      a first volume in the form of an upside-down funnel; and
      a distinct second volume forming a plinth at the bottom of the first volume and projecting perceptibly relative to said first volume in at least one horizontal direction to form a lateral projection; and
   a selector channel connecting said starter cavity to said molding cavity; and
   a support rod that is laterally offset relative to said selector channel, and that connects the second volume of the starter cavity to the molding cavity.

2. A mold according to claim 1, wherein a bottom end of the support rod is received in said lateral projection of the second volume.

3. A mold according to claim 2, wherein a minimum distance between the support rod and the first volume is greater than the sum of a thickness of the mold around the support rod plus a thickness of the mold around the first volume.

4. A mold according to claim 1, wherein the second volume projects horizontally around the entire perimeter of said first volume.

5. A mold according to claim 1, wherein said first volume is axisymmetric about a vertical axis.

6. A mold according to claim 1, wherein said second volume is not axisymmetric about a vertical axis.

7. A mold according to claim 1, wherein said selector channel is a baffle-shaped selector channel.

8. A mold according to claim 1, wherein said selector channel presents a round cross-section.

9. A casting method comprising at least the following steps:
   fabricating a mold according to claim 1;
   casting molten metal into the mold;
   cooling the metal with directional solidification of the metal starting from the starter cavity; and
   knocking out the mold in order to recover the raw metal casting.

* * * * *